US012668874B2

(12) United States Patent
Sharma

(10) Patent No.: US 12,668,874 B2
(45) Date of Patent: Jun. 30, 2026

(54) LIQUID PRECURSOR RECOVERY MODULE

(71) Applicant: Applied Materials, Inc., Santa Clara, CA (US)

(72) Inventor: Shashank Sharma, Chhattisgarh (IN)

(73) Assignee: Applied Materials, Inc., Santa Clara, CA (US)

( * ) Notice: Subject to any disclaimer, the term of this patent is extended or adjusted under 35 U.S.C. 154(b) by 378 days.

(21) Appl. No.: 18/327,738

(22) Filed: Jun. 1, 2023

(65) Prior Publication Data

US 2024/0401193 A1 Dec. 5, 2024

(51) Int. Cl.
*C30B 25/14* (2006.01)
*C23C 16/44* (2006.01)
*C23C 16/448* (2006.01)

(52) U.S. Cl.
CPC ...... *C23C 16/4481* (2013.01); *C23C 16/4411* (2013.01); *C23C 16/4412* (2013.01); *C23C 16/4487* (2013.01); *C30B 25/14* (2013.01)

(58) Field of Classification Search
CPC ............ C23C 16/4481; C23C 16/4411; C23C 16/4412; C23C 16/4487; C30B 35/00; C30B 25/14
See application file for complete search history.

(56) References Cited

U.S. PATENT DOCUMENTS

| | | | | |
|---|---|---|---|---|
| 7,858,522 B2 * | 12/2010 | Suzuki | ................ | C23C 16/4481 |
| | | | | 438/584 |
| 2005/0011414 A1 * | 1/2005 | Kehrmann | .............. | C04B 28/02 |
| | | | | 106/815 |
| 2006/0115589 A1 * | 6/2006 | Vukovic | ............. | C23C 16/4481 |
| | | | | 118/726 |
| 2008/0035062 A1 * | 2/2008 | Suzuki | .................... | C23C 16/16 |
| | | | | 118/728 |
| 2014/0127404 A1 * | 5/2014 | Yudovsky | ......... | C23C 16/45551 |
| | | | | 427/248.1 |
| 2014/0261733 A1 * | 9/2014 | Wu | ................... | C23C 16/45561 |
| | | | | 137/15.04 |

FOREIGN PATENT DOCUMENTS

SG 177208 A1 * 1/2012

* cited by examiner

*Primary Examiner* — Robert M Kunemund
(74) *Attorney, Agent, or Firm* — Kilpatrick Townsend & Stockton LLP LLP

(57) ABSTRACT

Vapor deposition precursor recovery systems and methods are provided. Methods and systems include a precursor container housing a precursor material and a carrier gas container housing a carrier gas. Systems and methods include a condenser assembly having a condenser in fluid connection with an exhaust line, a recycled precursor container, and a cooling circuit. Systems and methods include a vaporizer having one or more inlets in fluid connection with the precursor container and the carrier gas container, and an outlet in fluid connection with a gas distributor and the condenser assembly. Systems and methods include where the condenser is maintained at an internal temperature of greater than or about 10° C. below a boiling point of the precursor material and greater than or about 10° C. above a boiling point of the carrier gas.

19 Claims, 3 Drawing Sheets

300

200

Flow Precursor to Chamber ⟨ 205

Divert Precursor to Condenser System ⟨ 210

Condense Diverted Precursor ⟨ 215

Recycle Diverted Precursor ⟨ 220

LIQUID PRECURSOR RECOVERY MODULE

TECHNICAL FIELD

The present technology relates to systems and methods for semiconductor processing. More specifically, the present technology relates to systems and methods for recovering precursors for forming materials on semiconductor structures.

BACKGROUND OF THE INVENTION

Integrated circuits are made possible by processes which produce intricately patterned material layers on substrate surfaces. Producing patterned material on a substrate requires controlled methods for forming and removing material. As device sizes continue to reduce, and device complexity continues to increase, producing structures has become increasingly complex. Developing structures may take many more operations to produce the complex patterning and material integration. Additionally, as the number of material layers being patterned during processing is expanding as well as the reduction in layer thicknesses, reducing waste of precursor materials is becoming more challenging.

Thus, there is a need for improved systems and methods that can be used to produce high quality devices and structures while limiting material wastage. These and other needs are addressed by the present technology.

BRIEF SUMMARY OF THE INVENTION

The present technology is generally directed to vapor deposition precursor recovery methods and systems. Systems include a precursor container having a precursor material, a carrier gas container having a carrier gas, a condenser assembly, and a vaporizer. Condenser assemblies include a condenser in fluid connection with an exhaust line, a recycled precursor container, and a cooling circuit. Vaporizers include one or more inlets in fluid connection with the precursor container and the carrier gas container, and an outlet in fluid connection with a gas distributor and the condenser assembly. Systems include where the condenser is maintained at an internal temperature of greater than or about 10° C. below a boiling point of the precursor material and greater than or about 10° C. above a boiling point of the carrier gas.

In embodiments, systems include where an exhaust line inlet is disposed vertically above an outlet fluidly connected to the recycled precursor container. In further embodiments, systems include where the carrier gas includes an inert gas having a boiling point of less than or about 0° C. Moreover, in embodiments, systems include where the condenser is maintained at an internal temperature of less than or about 50% of a boiling point of the precursor material. Additionally or alternatively, in embodiments, the condenser has an internal pressure, and the exhaust line has an internal pressure, where a ratio of the condenser internal pressure and the exhaust line internal pressure is greater than or about 1.1.

The present technology is also generally directed to vapor deposition precursor recovery systems that include a precursor container having a precursor material therein, a carrier gas container having a carrier gas there, a vaporizer, and a condenser assembly. Vaporizers include one or more inlets in fluid connection with the precursor container and the carrier gas container, and an outlet in fluid connection with a gas distributor and a condenser assembly. Condenser assemblies include a condenser disposed between an exhaust line and the gas distributor, where the condenser is in fluid connection with a recycled precursor container and a cooling circuit. Systems include where the condenser has an internal pressure and the exhaust line has an internal pressure, where a ratio of the condenser internal pressure and the exhaust line internal pressure is greater than or about 1.1.

In embodiments, systems include where a system line is disposed between the vaporizer outlet and the gas distributor and between the vaporizer outlet and the condenser assembly, where the system line includes a split, a first end of the split connected to the condenser and a second end connected to the gas distributor. In further embodiments, a fluid flow path is defined from the vaporizer to the recycled precursor container, where the fluid flow path does not enter the exhaust line. In yet more embodiments, the condenser is maintained at an internal temperature of greater than or about 10° C. below a boiling point of the precursor material and greater than or about 10° C. above a boiling point of the carrier gas.

The present technology is also generally directed to methods for recycling a vapor deposition precursor. Methods include vaporizing a precursor material, flowing the vaporized precursor material and a carrier gas to a process chamber, diverting the vaporized precursor material and the carrier gas to a condenser after a preselected period of time, condensing the precursor material, exhausting the carrier gas, and collecting the condensed precursor material in a recycled precursor container.

In embodiments, methods include where the preselected period of time is less than or about 5 seconds. Moreover, in embodiments, the flowing and the diverting are repeated for greater than or about two cycles. In further embodiments, methods include re-filling the precursor material with the condensed precursor material after collection. Additionally or alternatively, in embodiments, methods include flowing a coolant and/or a processing cooling water into the condenser. In yet more embodiments, methods include where the coolant and/or processing cooling water is recirculated between a cooling chamber and the condenser. In further embodiments, the coolant and/or process cooling water comprises a temperature of greater than or about 10° C. below a boiling point of the precursor material and greater than or about 10° C. above a boiling point of the carrier gas. In embodiments, the condenser is directly connected to the vaporizer. Furthermore, in embodiments, exhausting the carrier gas includes connecting an exhaust line to a vacuum. In more embodiments, methods include reducing a pressure in the condenser to a pressure less than atmospheric pressure.

Such technology may provide numerous benefits over conventional systems and techniques. For example, embodiments of the present technology may divert unused precursor materials to a condenser, allowing for collection and recycling of precursor materials that would previously have been sent to exhaust. Additionally, the present technology may reduce material wastage without requiring pulsing or flow control speeds of precursor materials, which allows for the recycling of precursor materials without reducing the quality of the deposited material or negatively impacting the electrical properties of the semiconductor structure. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
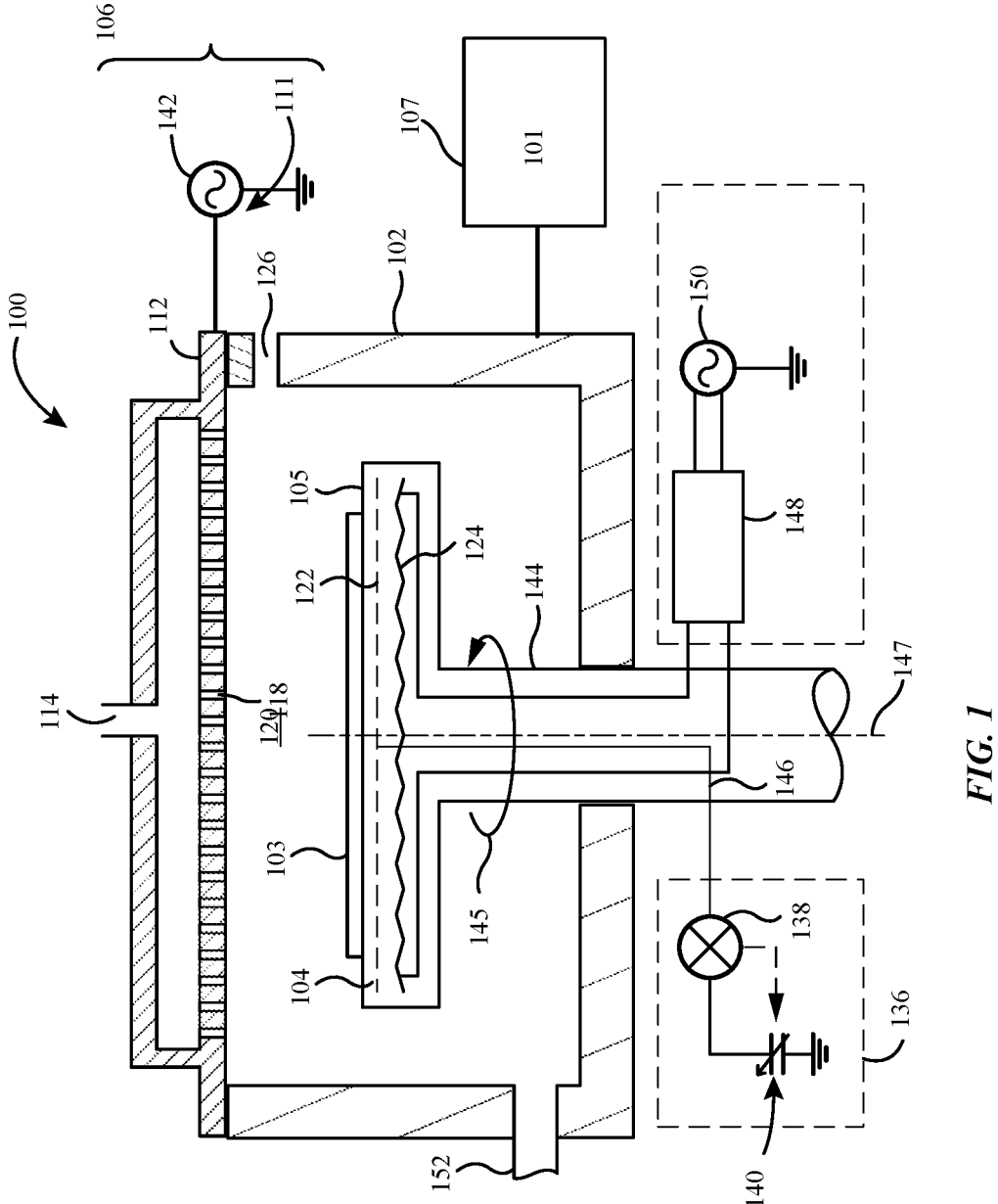
FIG. 1 shows a schematic cross-sectional view of an exemplary plasma system according to embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

As device sizes continue to shrink, many material layers may be reduced in thickness and size to scale devices. As the number of materials on a surface to be processed may increase, newer materials may be utilized to increase device performance. Atomic layer deposition (ALD) has been utilized to improve deposition in high aspect ratio/small scale features as well as on devices requiring reduce thickness and size. During an ALD process, reactant gases are sequentially introduced into a process chamber containing a substrate. Generally, a first gas precursor is pulsed into the process chamber and is adsorbed onto the substrate surface. A second reactant is pulsed into the process chamber and reacts with the first precursor to form a deposited material. A purge step is typically carried out between the delivery of each reactant gas. The purge step may be a continuous purge with the carrier gas or a pulse purge between the delivery of the reactant gases.

ALD processes require the pulsing of processes gasses at very small cycle times, such as even less than one second per cycle, particularly when reducing the size and thickness of material layers. Existing liquid flow modules are not able to provide precursors according to such limited cycle times, as the response time is too high. Efforts have been made to cycle precursors utilizing other methods, as precursor gasses are expensive, and may be difficult to dispose of due to their highly reactive and corrosive nature. However, such efforts have proven unsuccessful, as pulsing of the precursor causes undesirable flow fluctuations. Thus, currently, conventional systems utilize a system of valves such that the precursor is flowed continuously during the process and diverted into an exhaust system when not in use. Such a diversion results in 70% or more of all precursor gas being wasted to exhaust, causing issues with wastage, disposal, and cost.

The present technology overcomes these and other issues by including a condenser system tailored for precursor recovery on the diversion line. In such a manner, existing processes may still be utilized to provide steady, tailored flow of precursor, even at extremely small cycle times, while recovering more than 80% of precursor gasses sent to the exhaust line. Namely, such a condenser system may collect the recovered precursor material for later use (e.g. collected and stored in a container, such as an ampoule) or may be diverted back to the precursor liquid source. Thus, the present technology provides for a circular processes for the recovery and use of exhausted precursor materials, reducing waste without impacting processing or semiconductor properties.

Although the remaining disclosure will routinely identify specific deposition processes utilizing the disclosed technology, and will describe one type of semiconductor processing chamber, it will be readily understood that the processes described may be performed in any number of semiconductor processing chambers. Additionally, the present technology may be applicable to any number of semiconductor processes, beyond the exemplary process described below, such as other chemical vapor deposition (CVD) processes. Accordingly, the technology should not be considered to be so limited as for use with these specific deposition processes or chambers alone. In addition, while reference to ALD will be routinely utilized for explanatory purposes, it should be clear that the systems and methods discussed herein are equally suitable for other vapor deposition processes, such as CVD processes. In addition, the disclosure will discuss one possible chamber that may be used to perform processes according to embodiments of the present technology before methods of semiconductor processing according to the present technology are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers, etch material layers, form other material layers, or a combination thereof, although it is to be understood that deposition and etch methods may similarly be performed in any chamber within which deposition and etch processes may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. In some embodiments, the substrate support 104 may be rotatable, as indicated by the arrow 145, along an axis 147, where a shaft 144 of the substrate support 104 may be locate, or may be stationary. Alternatively, the substrate support 104 may be lifted up to rotate as necessary during a deposition process.

A gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

A first electrode 122 may be coupled with the substrate support 104. The first electrode 122 may be embedded within the substrate support 104 or coupled with a surface of the substrate support 104. The first electrode 122 may be a plate, a perforated plate, a mesh, a wire screen, or any other distributed arrangement of conductive elements. The first electrode 122 may be a tuning electrode and may be coupled with a tuning circuit 136 by a conduit 146, for example a cable having a selected resistance, such as 50 ohms, for example, disposed in the shaft 144 of the substrate support 104. The tuning circuit 136 may have an electronic sensor 138 and an electronic controller 140, which may be a variable capacitor. The electronic sensor 138 may be a voltage or current sensor and may be coupled with the second electronic controller 140 to provide further control over plasma conditions in the processing volume 120.

A second electrode 124, which may be a bias electrode and/or an electrostatic chucking electrode, may be coupled with the substrate support 104. The second electrode may be coupled with a second source of electric power 150 through a filter 148, which may be an impedance matching circuit. The second source of electric power 150 may be DC power, pulsed DC power. RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120, such as via a system controller 101 which may be contained within a processor 107. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the second electrode 124 in some embodiments.

Upon energizing a plasma in the processing volume 120, a potential difference may be established between the plasma and the first electrode 122. The electronic controller 140 may then be used to adjust the flow properties of the ground paths represented by the tuning circuit 136. A set point may be delivered to the first circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Tuning circuit 136 may have a variable impedance that may be adjusted using the electronic controller 140. Where the electronic controller 140 is a variable capacitor, the capacitance range of each of the variable capacitors, may be chosen to provide an impedance range. This range may depend on the frequency and voltage characteristics of the plasma, which may have a minimum in the capacitance range of each variable capacitor. Hence, when the capacitance of the electronic controller 140 is at a minimum or maximum, impedance of the tuning circuit 136 may be high, resulting in a plasma shape that has a minimum aerial or lateral coverage over the substrate support. When the capacitance of the electronic controller 140 approaches a value that minimizes the impedance of the tuning circuit 136, the aerial coverage of the plasma may grow to a maximum, effectively covering the entire working area of the substrate support 104. As the capacitance of the electronic controller 140 deviates from the minimum impedance setting, the plasma shape may shrink from the chamber walls and aerial coverage of the substrate support may decline.

The electronic sensor 138 may be used to tune the circuit 136 in a closed loop. A set point for current or voltage, depending on the type of sensor used, may be installed in each sensor, and the sensor may be provided with control software that determines an adjustment to the respective electronic controller 140 to minimize deviation from the set point. Consequently, a plasma shape may be selected and dynamically controlled during processing. It is to be understood that, while the foregoing discussion is based on electronic controller 140, which may be a variable capacitor, any electronic component with adjustable characteristic may be used to provide tuning circuit 136 with adjustable impedance.

Figure 2:
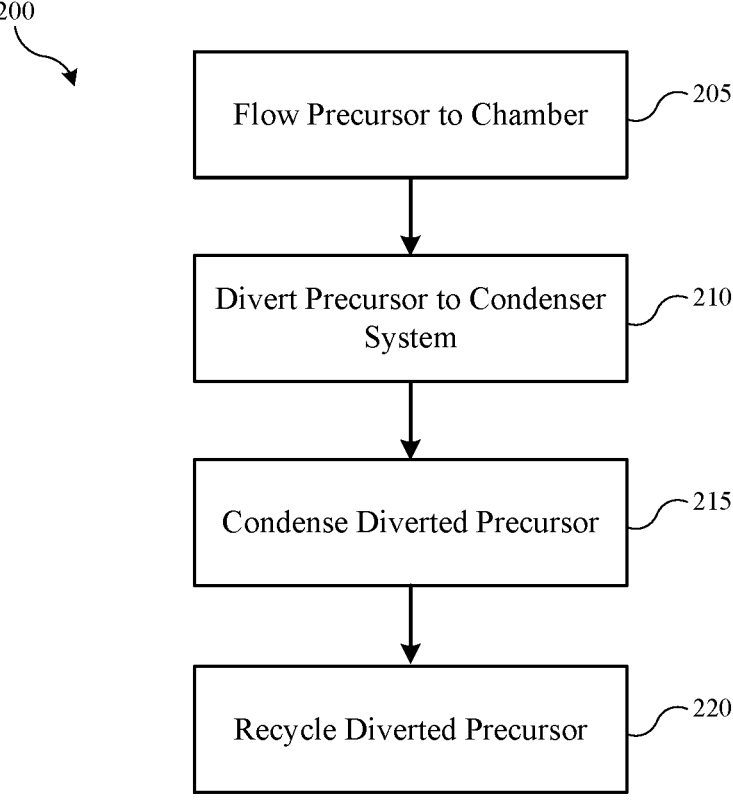
FIG. 2 shows operations in a semiconductor processing method according to embodiments of the present technology.

Processing chamber 100 may be utilized in some embodiments of the present technology for processing methods that may include formation, etching, or conversion of materials for semiconductor structures. It is to be understood that the chamber described is not to be considered limiting, and any chamber that may be configured to perform operations as described may be similarly used. FIG. 2 shows exemplary operations in a processing method 200 according to some embodiments of the present technology. The method may be performed with a variety of processing chambers and on one or more mainframes or tools, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations shown schematically in FIG. 3, the illustrations of which will be described in conjunction with the operations of method 200. It is to be understood that the figures illustrate only partial schematic views, and a system 300 may contain any number of additional materials and features having a variety of characteristics and aspects as shown in the figures.

For instance, in embodiments, methods according to the present technology include flowing a precursor 301 to chamber 302 via gas distributor 312 in order to deposit one or more layers of material on a substrate, at operation 205. Operation 205 may include providing a precursor 301 in a form suitable for a vapor deposition process or a thermal process, such as a precursor in liquid, gaseous, and/or plasma state. In embodiments, the precursor 301 is in liquid form, and may therefore be provided by vaporizing liquid precursor 301. In embodiments, the precursor 301 may be flowed by passing a carrier gas 304 (for example, nitrogen or argon) through valve 305 to a container 303, which may be an ampoule, in embodiments of the precursor 301, which may be in liquid form. In embodiments, the container may be heated.

Alternatively, the precursor(s) 301 may be dissolved in a solvent and used for direct liquid injection and flash vaporization. Exemplary solvents which may be used to dissolve the precursor may include one or more of isopropyl alcohol (IPA), 1-butanol, toluene, xylene, benzene, hexane, cyclohexane, tetrahydrofuran, dimethyl sulfoxide, dimethylformamide, acetonitrile, dichloromethane, ethyl acetate, chloroform, and combinations thereof, according to embodiments. The solvent may be an aromatic hydrocarbon, may be or be formed only of carbon and hydrogen, or may include or be formed only of carbon, hydrogen and oxygen in embodiments. When direct liquid injection and flash vaporization is/are used, there may be no need to heat the precursor solution until the liquid is transported to the vaporizer 306, which may improve the shelf life of the precursor.

Figure 3:
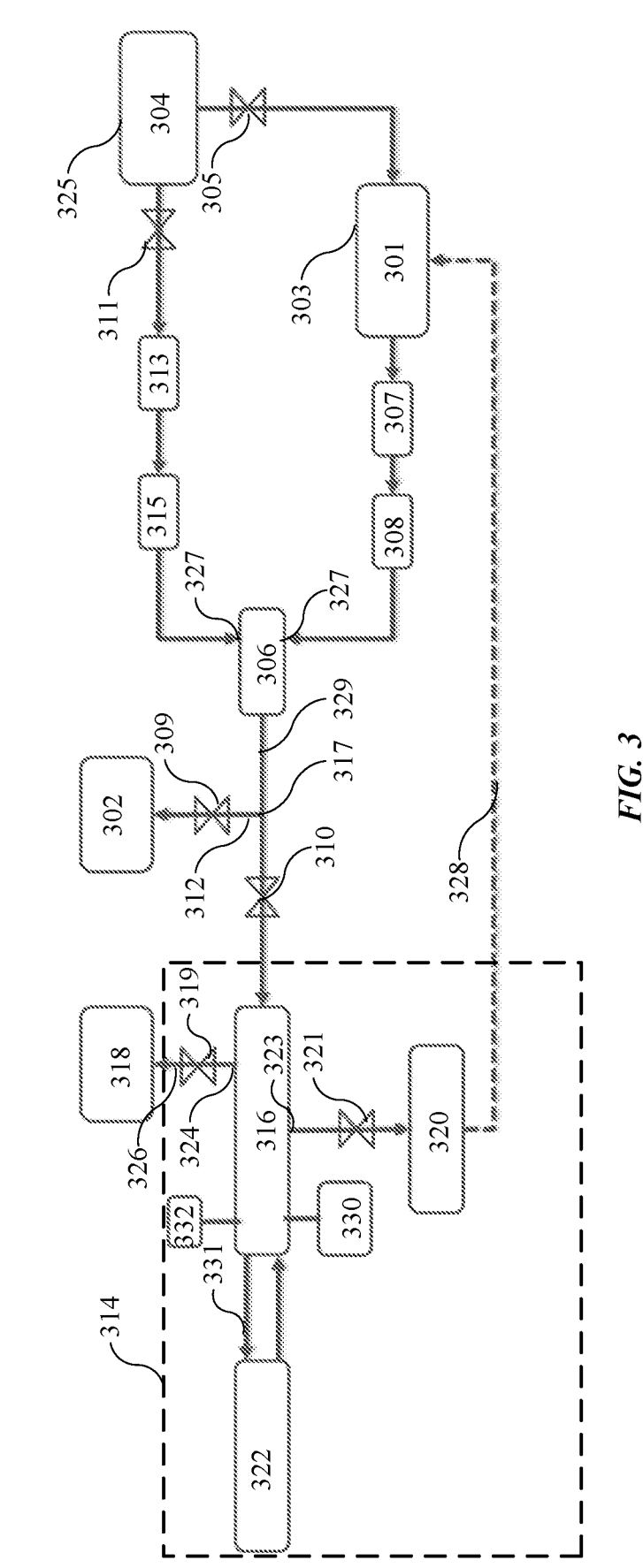
FIG. 3 show a schematic diagram of a precursor delivery system according to embodiments of the present technology.

In embodiments, the carrier gas 304 may be released via valve 311, pass through gas filter 313, and be controlled by mass flow controller 315 prior to entering vaporizer 306 for combination with precursor 301. In order to provide the precursor 301 to chamber 302 (and therefor to saturate a substate, such as substrate 103 discussed above), the mass flow controller 315 may be utilized to meter the carrier gas 304 to provide any suitable flow rate. Thus, in embodiments, the mass flow controller 315 may flow carrier gas 304 into vaporizer 306 (and therefore chamber 302) for a time period of about 10 seconds or less, such as less than or about 9 seconds, such as less than or about 8 seconds, such as less than or about 7 seconds, such as less than or about 6 seconds, such as less than or about 5 seconds, such as less than or about 4 seconds, such as less than or about 3 seconds, such as less than or about 2 seconds, such as less than or about 1 second, or any ranges or values therebetween, total or per cycle. However, in embodiments, the flow of the carrier gas 304 may be stopped at a time where the precursor 301 has adsorbed onto all reactive surface moieties on the substrate surface. Thus, as illustrated in FIG. 3, carrier gas container 325 may be in fluid connection with the precursor container 303, as well as one or more inlets 327 of vaporizer 306. Moreover, an outlet of vaporizer 306 may also be in fluid connection with chamber 302, such as via system line 329.

The carrier gas, the purge gas, the deposition gas, or other process gas may contain nitrogen, hydrogen, argon, neon, helium, or combinations thereof. In one example, the carrier gas is a noble gas, a non-reactive gas (e.g. inert gas), or combinations thereof, such as nitrogen, argon, or combinations thereof in embodiments.

The precursors may include one or more metals, oxygen, polymeric precursor, or a combination thereof. In embodiments, one of the precursors may include a metal and the other precursor may include oxygen with or without a metal. The precursor including oxygen may be referred to as an oxygen-containing precursor. The precursor may include, but is not limited to, a metal halide, a metal alkyl, a metal ethoxide, a metal sulfide, a metal cyclopentadienyl, a metal amide, a metal phosphine, a metal amine, a metal hydride, a metal carboxylate, a metal hydrazide, or a metal azide. The metal of the precursors may be, but is not limited to, Group 3A metals, transition metals, alkali metals, alkaline metals, noble metals, and other metals. For example, the metal of the precursors may be or include, but is not limited to, aluminum, gallium, iron, cobalt, nickel, niobium, tantalum, titanium, lithium, sodium, potassium, calcium, magnesium, silver, gold, iridium, zirconium, hafnium, scandium, strontium, yttrium, lanthanides (e.g., lanthanum), and the like.

Oxygen-containing precursors may include, but are not limited to, an alcohol, an alkoxide, a hydroxide, an acetylacetonate, an acetate, a formate, a nitrate, a sulfate, a phosphate, a phosphide, a carbonate, an oxide, an oxynitride, a perchlorate, an oxyhalide, a peroxide, an oxalate, or a phenolate. The compounds of the oxygen-containing precursor may afford a metal oxide material to be formed that is in direct contact with the substrate 103 or the material the metal oxide material is to be deposited on. Conventional ALD oxidants, such as water, steam, ozone, molecular oxygen, oxygen-containing plasma, and hydrogen peroxide may oxidize the substrate or underlying layer and form an interfacial layer between the metal oxide material and the substrate or the material the metal oxide material is to be deposited on. Accordingly, the initial formation of the metal oxide material may use an oxygen-containing precursor that is free of water, steam, ozone, molecular oxygen, oxygen-containing plasma, or hydrogen peroxide.

Further, as previously discussed, the precursor may include both oxygen and a metal. When the precursor includes both oxygen and metal, the precursor may be or include, but is not limited to, a metal alkoxide, a metal hydroxide, a metal acetylacetonate, a metal acetate, or a metal formate. In embodiments when the oxygen-containing precursor of the precursors also includes a metal, the metal may be the same metal as the other precursor, or the metal may be a different metal than the metal of the other precursor. In embodiments, different metals may be used in the various precursors to form materials that include a plurality of materials, such as mixed metal oxide materials. However, it should be clear that the present technology may be utilized with any precursors, oxidizers, and/or carrier gasses as known in the art, as the techniques according to the present technology discuss the collection and re-use of the precursor.

Regardless of the methods utilized for delivering the precursor 301 to vaporizer 306, the precursor 301 may pass through a filter 307 and a flow module 308. In embodiments, the precursor 301 can be delivered at any suitable flow rate within a range from about 10 sccm to about 2,000 sccm, for example, such as about 50 sccm to about 1,000 sccm, such as about 100 sccm to about 500 sccm, or any ranges or values therebetween. In embodiments, the filter 307 may be utilized to control the particle size of precursor particles in precursor 301.

In order to provide the precursor 301 to chamber 302 (and therefor to saturate a substate, such as substrate 103 discussed above), the flow module 308 may be utilized to meter the precursor 301 to provide any one or more of the above flow rates. Thus, in embodiments, the flow module may flow precursor 301 into chamber 302 for a time period of about 10 seconds or less, such as less than or about 9 seconds, such as less than or about 8 seconds, such as less than or about 7 seconds, such as less than or about 6 seconds, such as less than or about 5 seconds, such as less than or about 4 seconds, such as less than or about 3 seconds, such as less than or about 2 seconds, such as less than or about 1 second, or any ranges or values therebetween. However, in embodiments, the flow of the precursor gas may be stopped at a time where the precursor has adsorbed onto all reactive surface moieties on the substrate surface. Nonetheless, as illustrated in FIG. 3, precursor container 303 is in fluid connection with carrier gas container 325 as well as one or more inlets 327 of vaporizer 306.

Namely, as discussed above, after saturation with precursor 301, the substrate and chamber may be exposed to a purge step after stopping the flow of the precursor 301. A purge gas may be administered into the processing chamber, such as via gas distributor 112 as discussed above, with any suitable flow rate within a range from about 10 sccm to about 2,000 sccm, for example, such as about 50 sccm to about 1,000 sccm, such as about 100 sccm to about 500 sccm, or any ranges or values therebetween. The purge step removes any excess precursor, byproducts and other contaminants within the processing chamber. The purge step may be conducted for a time period of about 10 seconds or less, such as less than or about 9 seconds, such as less than or about 8 seconds, such as less than or about 7 seconds, such as less than or about 6 seconds, such as less than or about 5 seconds, such as less than or about 4 seconds, such as less than or about 3 seconds, such as less than or about 2 seconds, such as less than or about 1 second, or any ranges or values therebetween. In embodiments, pumping may be used, in addition to the purge steps, to enhance the evacuation efficiency.

After the first purge, the substrate active sites can be exposed a co-reactant, also referred to as an oxidant herein, which may be in the form of a gas or vapor, formed by passing a carrier gas (for example, nitrogen or argon) through a container of the co-reactant. The co-reactant container may also be heated. The co-reactant can be delivered at any suitable flow rate within a range from about 10 sccm to about 2,000 sccm, for example, such as about 50 sccm to about 1,000 sccm, such as about 100 sccm to about 500 sccm, or any ranges or values therebetween. The co-reactant may be flowed for time period of about 10 seconds or less, such as less than or about 9 seconds, such as less than or about 8 seconds, such as less than or about 7 seconds, such as less than or about 6 seconds, such as less than or about 5 seconds, such as less than or about 4 seconds, such as less than or about 3 seconds, such as less than or about 2 seconds, such as less than or about 1 second, or any ranges or values therebetween. The flow of the co-reactant gas may be stopped once the co-reactant has adsorbed onto and reacted with precursor 301.

Regardless of the precursors and reactants utilized, there may be a determination of whether a target thickness of as-deposited second metal oxide material on the substrate 103 has been achieved following one or more cycles of forming the material layer containing the precursor(s) on the substrate 103. If a target thickness of the material has not been achieved, another cycle of layer formation may be performed. If a target thickness of the one or more material layers has been achieved, another cycle may not be started. Exemplary numbers of cycles for the formation of the one or more layers may include 1 cycle, or may include greater than 2 cycles, 5 cycles, 10 cycles, 25 cycles, 50 cycles, 100 cycles, or more. Additional exemplary ranges for the number of cycles may include 50 cycles to 2000 cycles, 50 cycles to 1000 cycles, and 100 cycles to 750 cycles, among other exemplary ranges. Exemplary ranges of target thickness to discontinue further cycles of formation include about 1 Å to about 500 Å. Additional exemplary thickness ranges may include about 2 Å to about 300 Å, and 3 Å to about 200 Å, among other exemplary thickness ranges.

As noted above, in embodiments, a full cycle of an ALD process may occur for less than or about 5 seconds, such as less than or about 4 seconds, such as less than or about 3 seconds, such as less than or about 2 seconds, such as less than or about 1 second, or any ranges or values therebetween, where it is only desired to flow precursor 301 for less than or about 70% of the total cycle time, such as less than or about 60%, such as less than or about 55%, such as less than or about 50%, such as less than or about 45%, such as less than or about 40%, such as less than or about 35%, such as less than or about 30% of the total cycle time, or any ranges or values therebetween. However, flow modules 308 do not have an adequate response time to flow processes gasses, such as precursor 301 for less than one second. Moreover, as discussed above, even if such a response time was possible, such quick pulses would result in flow variations. Thus, existing systems flow the precursor 301 for the entirety of the cycle, and utilize valves, such as valves 309 and 310 to alternate sending precursor 301 directly to exhaust (not shown, directly after valve 310 in a conventional system) and process chamber 302.

Conversely, the present technology has surprisingly found that a condenser system 314 can be included between the gas distributor 312 and exhaust 318. Thus, in such embodiments, the precursor 301 may be flowed from vaporizer 306, through system line 329, along a first end of split 317 which is connected to gas distributor 312, to chamber 302 by controlling valve 309. When saturation has occurred, valve 309 may be closed, and valve 310 is opened, diverting precursor 301 to a second end of split 317 in system line 329, which is connected to condenser system 314 at operation 210. Valves 305, 309, 310, 311 may each regulate the flow of one or more process gasses and may be any of numerous commercially available valves such as butterfly valves, throttle valves and the like. In embodiments, activation of the valves 305, 309, 310, 311 may be accomplished by a controller, such as system controller 101, which is preferably connected to the processor 107 to receive signals therefrom. In addition, while only one cycle of an ALD process is discussed herein in regards to FIG. 2, it should be clear that multiple cycles of operations 205 and 210 may be conducted. In such embodiments, condensing operation 215, discussed below in greater detail, may be conducted between each cycle of operations 205, 210, after the ALD process is complete (e.g. all cycles of 205, 210 are complete), continuously throughout the ALD process, or may be conducted when the condenser reaches a minimum volume of carrier gas 304 and precursor 301.

While only the system 300 of precursor 301 is illustrated, it should be understood that replicates of system 300 may be utilized for each precursor and process gas utilized in the desired process. For instance, in embodiments, it may be desired to pulse or alternate flow of one or more precursors, such greater than or about two, such as greater than or about four, such as greater than or about five, such as greater than or about six, or any ranges or values therebetween. In such an aspect, a system 300 may be connected to gas distributor 312 (or have a dedicated gas distributor), for each precursor, oxidizer and/or other process gas utilized.

Nonetheless, condenser system 314 includes a condenser 316 connected to a coolant chamber 322, via a coolant circuit 331, containing one or more coolants and/or process cooling water (PCW). A coolant/PCW is circulated from the coolant chamber 322 and condenser 316 and recirculated back to coolant chamber 322 in order to maintain condenser 316 at a desired internal process temperature. Namely, the present technology has found that an internal condenser temperature may be carefully selected and controlled in order to condense and collect a precursor in a sufficient purity in order to be recycled and reused as well as to be collected with a high degree of efficiency. Thus, a cooling circuit 331 temperature, and therefore an internal condenser 316 temperature is selected in order to rapidly condense the precursor 301 such that the precursor 301 condenses back into a liquid while carrier gas 304 remains in the gaseous state and proceeds to exhaust 318.

Thus, in embodiments, the coolant temperature and/or internal condenser 316 temperature may be at least about 5° C. less than a boiling point of the precursor 301, such as greater than or about 10° C., such as greater than or about 15° C., such as greater than or about 20° C., such as greater than or about 25° C., such as greater than or about 30° C., such as greater than or about 40° C., such as greater than or about 50° C., such as greater than or about 60° C., such as greater than or about 70° C., such as greater than or about 80° C., such as greater than or about 90° C., such as greater than or about 100° C., such as greater than or about 125° C., such as greater than or about 150° C., such as greater than or about 175° C., such as greater than or about 200° C. such as greater than or about 225° C., such as greater than or about 250° C., such as greater than or about 275° C., such as greater than or about 300° C. lower than a boiling point of the precursor selected, or any ranges or values therebetween.

Stated differently, in embodiments, the coolant temperature and/or internal condenser 316 temperature may be less than or about 90% of a boiling point of the selected precursor, such as less than or about 85%, such as less than or about 80%, such as less than or about 75%, such as less than or about 70%, such as less than or about 65%, such as less than or about 60%, such as less than or about 55%, such as less than or about 50%, such as less than or about 45%, such as less than or about 40%, such as less than or about 35%, such as less than or about 30%, such as less than or about 25%, such as less than or about 20%, such as less than or about 15%, such as less than or about 10%, such as less than or about 5%, such as less than or about 2.5% of a boiling point of the selected precursor, or any ranges or values therebetween.

However, in embodiments, the coolant temperature and/or internal condenser 316 temperature should also be selected to be significantly greater than a boiling point of the carrier gas 304 in order to condense predominantly or exclusively precursor 301. Thus, in embodiments, the coolant temperature and/or internal condenser 316 temperature may be at least about 5° C. greater than a boiling point of the carrier gas 304, such as greater than or about 10° C., such as greater than or about 15° C., such as greater than or about 20° C., such as greater than or about 25° C., such as greater than or about 30° C., such as greater than or about 40° C., such as greater than or about 50° C., such as greater than or about 60° C., such as greater than or about 70° C., such as greater than or about 80° C., such as greater than or about 90° C., such as greater than or about 100° C., such as greater than or about 125° C., such as greater than or about 150° C., such as greater than or about 175° C., such as greater than or about 200° C., such as greater than or about 225° C., such as greater than or about 250° C., such as greater than or about 275° C., such as greater than or about 300° C. higher than a boiling point of the carrier gas selected, or any ranges or values therebetween.

Stated differently, in embodiments, the coolant temperature and/or condenser 316 temperature may be greater than or about 110% of a boiling point of the selected carrier gas, such as greater than or about 115%, such as greater than or about 120%, such as greater than or about 125%, such as greater than or about 130% such as greater than or about 135%, such as greater than or about 140%, such as greater than or about 145%, such as greater than or about 150%, such as greater than or about 155%, such as greater than or about 160%, such as greater than or about 165%, such as greater than or about 170%, such as greater than or about 170%, such as greater than or about 175%, such as greater than or about 180%, such as greater than or about 185%, such as greater than or about 190%, such as greater than or about 195% of a boiling point of the selected carrier gas, or any ranges or values therebetween.

Thus, in embodiments, it may be desirable to select a carrier gas from noble gasses, inert gasses, and/or any other gas that is inert/non-reactive with the precursor 301 and stable in a gaseous form at room temperature and atmospheric pressure. For instance, the carrier gas may be any inert gas having a boiling point of less than or about 15° C., such as less than or about 10° C., such as less than or about 0° C., such as less than or about –10° C., such as less than or about –20° C., such as less than or about –30° C., such as less than or about –40° C., such as less than or about –50° C., such as less than or about –60° C., such as less than or about –70° C., such as less than or about –80° C., such as less than or about –90° C., such as less than or about –100° C., such as less than or about –125° C., such as less than or about –150° C., such as less than or about –175° C. such as less than or about –180° C., such as less than or about –185° C., or any ranges or values therebetween.

As noted above, the carrier gas 304 may therefore remain in a gaseous state upon entering condenser 316 and may be directed to exhaust 318 via a valve 319, as condenser 316 is in fluid connection with exhaust 318 via exhaust line 326. While not shown, the exhaust 318 may also be in fluid communication with a vacuum system. The vacuum system can be any suitable vacuum system including an individual vacuum pump or a system foreline. Thus, in embodiments, valve 319 may be a pump valve, and may be positioned to isolate the condenser 316 from the pump line.

However, due to exhaust 318 being in fluid communication with a vacuum system, an inlet 324 of exhaust line 326 may create a vacuum environment in condenser 316. Thus, in embodiments, to ensure the precursor 301 is being condensed and not exhausted, the condenser may have an internal pressure higher than an internal pressure of the exhaust line 326, such as a pressure of the exhaust line 326 at inlet 324. Such an arrangement allows for a localized vacuum environment at inlet 324 to encourage exhaust of carrier gas 304 without exhausting precursor 301. Thus, in embodiments, a ratio between an internal pressure in the condenser 316 and an internal pressure in exhaust line 326, such as an internal pressure of the exhaust line 326 at inlet 324, may be greater than or about 1.1, such as greater than or about 1.2, such as greater than or about 1.3, such as greater than or about 1.4, such as greater than or about 1.5, such as greater than or about 1.6, such as greater than or about 1.7, such as greater than or about 1.8, such as greater than or about 1.9, such as greater than or about 2, such as greater than or about 2.1, such as greater than or about 2.2, such as greater than or about 2.3, such as greater than or about 2.4, such as greater than or about 2.5, or any ranges or values therebetween.

Stated differently, an internal pressure of the condenser 316 may be less than atmospheric pressure, but greater than or about 2 torr, such as greater than or about 2.5 torr, such as greater than or about 3 torr, such as greater than or about 3.5 torr, such as greater than or about 4 torr, such as greater than or about 4.5 torr, such as greater than or about 5 torr, such as greater than or about 5.5 torr, such as greater than or about 6 torr, such as greater than or about 6.5 torr, such as greater than or about 7 torr, such as less than or about 100 torr, such as less than or about 75 torr, such as less than or about 50 torr, such as less than or about 25 torr, such as less than or about 10 torr, or any ranges or values therebetween. Additionally or alternatively, an internal pressure in exhaust line 326, such as an internal pressure of the exhaust line 326 at inlet 324 may be less than or about 3 torr, such as less than or about 2.5 torr, such as less than or about 2 torr, such as less than or about 1.5 torr, such as less than or about 1 torr, or any ranges or values therebetween. In embodiments, condenser 316 may therefore include a relief valve 330 and a pressure sensor 332 to monitor and control the pressure.

Additionally or alternatively, in embodiments, the condenser 316 may be arranged with the exhaust inlet 324 disposed vertically above recycled precursor container 320, alone or in combination with any one or more of the above pressure gradients between the inlet 324 and internal pressure of condenser 316. By utilizing such an arrangement, the carrier gas 304 may be encouraged to exhaust 318 while precursor 301 is directed to recycled precursor container 320 via outlet 323.

Nonetheless, the precursor 301 may be condensed back into a liquid or solid form, and collected in recycled precursor container 320, which is in fluid connection with condenser 316, such as by opening valve 321. Surprisingly, by utilizing the condenser 316 in-line (e.g., in-situ in the system 300), and particularly between the gas distributor 312 and the exhaust 318, a recycled precursor 301 is collected in recycled precursor container 320 with excellent purity (e.g., little to no contamination or presence of non-precursor materials). Namely, in embodiments, condenser 316 may be directly connected to vaporizer 366, such as by system line 329.

For instance, in embodiments, the recycled precursor collected in recycled precursor container 320 may be greater than or about 90 wt. % precursor particles, such as greater than or about 92.5 wt. %, such as greater than or about 95 wt. %, such as greater than or about 97.5 wt. %, such as greater than or about 98 wt. %, such as greater than or about 99 wt. %, such as greater than or about 99.5 wt. %, such as greater than or about 99.9 wt. %, such as even up to about 100 wt. %, based upon the weight of the liquid collected in recycled precursor container 320, or any ranges or values therebetween. Surprisingly, it was found that such high purities may be obtained even without any purification or filtration steps during or after the condensing operation 215. Without wishing to be bound by theory, it is believed that the high purity is obtained at least in part due to the separation of the condenser 316 and recycled precursor container 320 from exhaust 318, namely, a fluid flow path does not pass through exhaust 318 prior to the condensing operation 215, thus defining a precursor 301 flow path from vaporizer 306, through condenser 316, to recycled precursor container 320, without entering exhaust 318/exhaust line 326. It is believed that system 300 remains largely uncontaminated (other that the mixing of the carrier gas 304 and precursor 301) until the exhaust system 318, where other process gasses and contaminants may be introduced.

In addition, in embodiments, the condensing operation 215 may occur continuously during the ALD operation in order to separate the precursor 301 from the carrier gas 304 as they enter the condenser. In other embodiments, the precursor 301 and carrier gas 304 may be collected in condenser 316 and separated after a pre-determined volume of the carrier gas 304 and precursor 301 have been collected, or any of the other methods discussed above. Regardless of the collection methods and processes utilized, the present technology has surprisingly found that greater than or about 70 wt. % of the diverted precursor is condensed and collected in recycled precursor container 320, such as greater than or about 75 wt. %, such as greater than or about 80 wt. %, such as greater than or about 85 wt. %, such as greater than or about 90 wt. %, such as greater than or about 95 wt. %, such as greater than or about 97.5 wt. %, such as greater than or about 99 wt. %, such as greater than or about 99.5 wt. %, such as greater than or about 99.9 wt. %, or any ranges or values therebetween, based upon the weight of the diverted precursor 301.

Upon collection of an amount of recycled precursor 301 (e.g. when recycled precursor container 320 is full or filled to a pre-process fill line or volume), the container may be removed by closing valve 321 and removing recycled precursor container 320. Thus, at operation 220, the recycled precursor container 320 containing the recycled precursor 301 may be returned to the start of the process, as illustrated by reference number 328, and either used to replace precursor container 303 directly, refill precursor container 303, or stored for later replacement of precursor container 303. Moreover, recycled precursor container 320 may be replaced with an empty container and allowed to collect further recycled precursor 301 by opening valve 321. However, in embodiments, recycled precursor container 320 may continuously drain along 328, refilling precursor container 303.

Although the above discussed embodiments utilize real-time monitoring and adjustments of the one or more valves and/or condenser system 314, various alternatives may be employed according to the technology described herein. For example, the condenser system 314 and/or one or more valves may be controlled manually by an operator observing the flow or fill level of recycled precursor container 320. For instance, the system software allows for both an automatic real-time adjustment mode as well as an operator (manual) mode. Further, although multiple controllers may be utilized, such as for each valve and/or for condenser system 314, a single controller may be used to operate various constituents of the system. Other embodiments will be apparent to those skilled in the art.

Nonetheless, it should be understood that, in embodiments, the method according to the present disclosure includes a non-transitory computer readable medium having instructions stored thereon that, when executed, cause the system 300 to execute the method for vapor deposition precursor recovery. For instance, in embodiments, a non-transitory computer readable medium may execute any one or more operations of the method, such as controlling diversion valves 309, 310, cooling circuit 331 temperature, condenser 316 internal pressure, or the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A vapor deposition precursor recovery system, comprising:
    a precursor container comprising a precursor material;
    a carrier gas container comprising a carrier gas;
    a condenser assembly comprising a condenser in fluid connection with an exhaust line, a recycled precursor container, and a cooling circuit;
    a vaporizer having one or more inlets in fluid connection with the precursor container and the carrier gas container, and an outlet in fluid connection with a gas distributor and the condenser assembly; and
    a system line disposed between the outlet of the vaporizer and the gas distributor, and between the outlet of the vaporizer and the condenser assembly, the system line comprising a split, a first end of the split connected to the condenser and a second end of the split connected to the gas distributor;
    wherein the condenser is maintained at an internal temperature of greater than or about 10° C. below a boiling point of the precursor material and greater than or about 10° C. above a boiling point of the carrier gas.

2. The recovery system of claim 1, wherein an exhaust line inlet is disposed vertically above an outlet fluidly connected to the recycled precursor container.

3. The recovery system of claim 1, wherein the carrier gas comprises an inert gas having a boiling point of less than or about 0° C.

4. The recovery system of claim 1, wherein the condenser is maintained at an internal temperature of less than or about 50% of a boiling point of the precursor material.

5. The recovery system of claim 1, wherein the condenser comprises an internal pressure and the exhaust line comprises an internal pressure, wherein a ratio of the condenser internal pressure and the exhaust line internal pressure is greater than or about 1.1.

6. A vapor deposition precursor recovery system, comprising:
    a precursor container comprising a precursor material;
    a carrier gas container comprising a carrier gas;
    a vaporizer having one or more inlets in fluid connection with the precursor container and the carrier gas container, and an outlet in fluid connection with a gas distributor and a condenser assembly;
    the condenser assembly comprising a condenser disposed between an exhaust line and the gas distributor, wherein the condenser is in fluid connection with a recycled precursor container, and a cooling circuit; and
    a system line disposed between the outlet of the vaporizer and the gas distributor, and between the outlet of the vaporizer and the condenser assembly, the system line comprising a split, a first end of the split connected to the condenser and a second end of the split connected to the gas distributor;
    wherein the condenser comprises an internal pressure and the exhaust line comprises an internal pressure, wherein a ratio of the condenser internal pressure and the exhaust line internal pressure is greater than or about 1.1.

7. The recovery system of claim 6, wherein a fluid flow path is defined from the vaporizer to the recycled precursor container, and wherein the fluid flow path does not enter the exhaust line.

8. The recovery system of claim 6, wherein the condenser is maintained at an internal temperature of greater than or about 10° C. below a boiling point of the precursor material and greater than or about 10° C. above a boiling point of the carrier gas.

9. A method for recycling a vapor deposition precursor, comprising:
    vaporizing a precursor material a vaporizer;
    flowing the vaporized precursor material and a carrier gas to a process chamber by a system line;
    diverting the vaporized precursor material and the carrier gas to a condenser after a preselected period of time by the system line, wherein the system line comprises a split, a first end of the split connected to the condenser and a second end of the split connected to the process chamber;
    condensing the precursor material;
    exhausting the carrier gas; and
    collecting the condensed precursor material in a recycled precursor container.

10. The method of claim 9, wherein the preselected period of time is less than or about 5 seconds.

11. The method of claim 9, wherein the flowing and the diverting are repeated for greater than or about two cycles.

12. The method of claim 9, further comprising re-filling the precursor material with the condensed precursor material after collection.

13. The method of claim 9, further comprising flowing a coolant and/or a process cooling water into the condenser.

14. The method of claim 13, wherein the coolant and/or process cooling water is recirculated between a cooling chamber and the condenser.

15. The method of claim 13, where the coolant and/or process cooling water comprises a temperature of greater than or about 10° C. below a boiling point of the precursor material and greater than or about 10° C. above a boiling point of the carrier gas.

16. The method of claim 9, wherein the condenser is directly connected to the vaporizer.

17. The method of claim 9, wherein exhausting the carrier gas comprises connecting an exhaust line to a vacuum.

18. The method of claim 9, further comprising reducing a pressure in the condenser to a pressure less than atmospheric pressure.

19. The method of claim 18, wherein the pressure is greater than a pressure in the exhaust line.

* * * * *